United States Patent [19]

Elsaesser et al.

[11] Patent Number: 5,275,908
[45] Date of Patent: Jan. 4, 1994

[54] RADIATION-SENSITIVE MIXTURE AND RECORDING MATERIAL COMPRISING AS A BINDER A COPOLYMER HAVING HYDROXYBENZYL(METH)ACRYLATE GROUPS OR DERIVATIVES THEREOF

[75] Inventors: Andreas Elsaesser, Idstein; Dieter Mohr, Budenheim, both of Fed. Rep. of Germany

[73] Assignee: Hoechst Aktiengesellschaft, Frankfurt am Main, Fed. Rep. of Germany

[21] Appl. No.: 646,842

[22] Filed: Jan. 28, 1991

[30] Foreign Application Priority Data

Jan. 27, 1990 [DE] Fed. Rep. of Germany ....... 4002397

[51] Int. Cl.$^5$ .................... G03F 7/023; G03F 7/30; G03C 1/77
[52] U.S. Cl. ..................... 430/165; 430/191; 430/192; 430/193; 430/270; 430/272; 430/278; 430/326; 430/90
[58] Field of Search ............... 430/192, 193, 270, 165, 430/166, 191, 908, 910, 272, 278, 945

[56] References Cited

U.S. PATENT DOCUMENTS

| | | | |
|---|---|---|---|
| 3,116,305 | 12/1963 | Morris et al. | 260/410.5 |
| 3,515,552 | 6/1970 | Smith | 96/35.1 |
| 3,753,943 | 8/1973 | Ueno et al. | 260/32.6 A |
| 3,779,778 | 12/1973 | Smith et al. | 96/115 R |
| 3,869,292 | 3/1975 | Peters | 96/115 R |
| 4,101,323 | 7/1978 | Buhr et al. | 430/270 |
| 4,139,384 | 2/1979 | Iwasaki et al. | 96/33 |
| 4,247,611 | 1/1981 | Sander et al. | 430/286 |
| 4,248,957 | 2/1981 | Sander et al. | 430/270 |
| 4,275,138 | 6/1981 | Kita et al. | 430/910 |
| 4,311,782 | 1/1982 | Buhr et al. | 430/270 |
| 4,551,409 | 11/1985 | Gulla et al. | 430/192 |
| 4,619,998 | 10/1986 | Buhr | 544/193.1 |
| 4,678,737 | 7/1987 | Schneller et al. | 430/270 |
| 4,699,867 | 10/1987 | Schneller et al. | 430/192 |
| 4,822,719 | 4/1989 | Schneller et al. | 430/270 |
| 4,910,119 | 3/1990 | Schneller et al. | 430/192 |
| 5,068,163 | 11/1991 | Elsaesser et al. | 430/192 |

FOREIGN PATENT DOCUMENTS

| | | |
|---|---|---|
| 0187517 | 7/1986 | European Pat. Off. . |
| 0323854 | 7/1989 | European Pat. Off. . |
| 3820699 | 12/1989 | Fed. Rep. of Germany . |
| 3831782A1 | 3/1990 | Fed. Rep. of Germany . |
| 7636129 | 3/1976 | Japan . |
| 739654 | 11/1955 | United Kingdom . |
| 1154749 | 6/1969 | United Kingdom . |

OTHER PUBLICATIONS

Abstract-83-817511/46 E14A41 MITK 31.03.82 JP 051020.

Primary Examiner—Charles L. Bowers, Jr.
Assistant Examiner—John S. Chu
Attorney, Agent, or Firm—Foley & Lardner

[57] ABSTRACT

A positive-working radiation-sensitive mixture and recording material are disclosed. The mixture contains, as essential constituents, a 1,2-quinone diazide and/or a combination of a compound which forms strong acid on exposure to actinic radiation and a compound containing at least one cleavable C—O—C bond and a polymeric binder containing repeating units of formula I

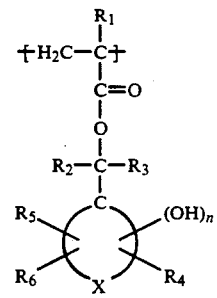

in which $R_1$ is a hydrogen or halogen atom, or a cyanide or an alkyl group, $R_2$, $R_3$ are identical or different and are hydrogen, or alkyl or aryl groups, $R_4$, $R_5$ are identical or different and are and $R_6$ hydrogen or halogen atoms, or alkyl, alkoxy or aryl groups, X represents the atoms necessary to complete a monocyclic or polycyclic carbocyclic aromatic ring system, and is 1, 2 or 3.

The mixture yields lithographic plates having high print runs which can be thermally post-cured and which have good resistance to chemicals. The mixture also produces photoresists having good heat resistance.

20 Claims, No Drawings

RADIATION-SENSITIVE MIXTURE AND RECORDING MATERIAL COMPRISING AS A BINDER A COPOLYMER HAVING HYDROXYBENZYL(METH)ACRYLATE GROUPS OR DERIVATIVES THEREOF

BACKGROUND OF THE INVENTION

The present invention relates to a positive-working radiation-sensitive or photosensitive mixture that contains, as essential constituents, a water-insoluble polymeric binder which is soluble in aqueous-alkaline solutions and a 1,2-quinone diazide and/or a combination of a compound which forms strong acid on exposure to actinic radiation and a compound containing at least one cleavable C—O—C bond. The invention also relates to a radiation-sensitive recording material composed of a layer base on which the radiation-sensitive mixture is deposited.

Positive-working photosensitive mixtures, i.e., mixtures used to produce a copying layer which becomes soluble where exposed, are known and have been described for a wide variety of possible applications, including lithographic plates and photoresists. A substantial number of the properties of these copying layers is determined by the polymeric binder. The binders used for positive copying layers are virtually exclusively phenol formaldehyde or cresol formaldehyde condensation products of the novolak type. For some applications of positive copying layers, however, the properties resulting therefrom are still not ideal. This is true, in particular, of the heat resistance when the mixture is used as a photoresist, and of the number of print runs when the mixture is used as a lithographic plate.

It has been found that substitution of novolaks by binders having higher glass transition temperatures results in a generally better property profile. Thus, a whole series of alkali-soluble binders for positive copying layers have been described, such as, for example, naphthol-based phenolic resins (U.S. Pat. No. 4,551,409), homopolymers and copolymers of vinylphenols (DE 2,322,230, corresponding to U.S. Pat. No. 3,869,292 and DE 3,406,927, corresponding to U.S. Pat. No. 4,678,737), polymers of the esters of acrylic acids with phenols (Japanese Published Specification 76/36,129, Ep 212,440 and EP 212,439) or copolymers of hydroxyphenylmaleimides (Ep 187,517).

Binders of the type mentioned have, however, hitherto not found any practical application. One reason for this is that these polymers do not satisfactorily fulfill an essential requirement imposed on binders of positive copying layers, i.e., the facility for thermal self-crosslinking. This property, which exists in the case of novolaks, is of significance in cases where the copying layer is intended to resist aggressive chemicals. In this respect it is also known to incorporate in the polymers units which, although they are not alkali-soluble, make thermal crosslinking possible (EP 184,044). As a result of this, however, other properties, such as development behavior and storage stability of the mixture, are impaired.

DE 3,820,699 describes polymers based on hydroxybenzylacrylamides which meet the requirement for crosslinkable alkali-soluble monomer units. It is disadvantageous, however, that the polymers can only contain these monomers in a limited amount, since otherwise photosensitivity and development behavior are affected unfavorably.

SUMMARY OF THE INVENTION

It is therefore an object of the present invention to provide a positive-working radiation-sensitive mixture with which lithographic plates having higher print run performance and photoresists with improved heat resistance can be produced.

It is a further object of the invention to provide a radiation-sensitive mixture which is thermally crosslinkable without its photosensitivity and its development behavior being impaired.

These and other objects according to the invention are achieved by a positive-working radiation-sensitive mixture, comprising (1) a radiation-sensitive component selected from the group consisting of (a) a 1,2-quinone diazide, and (b) a combination of a compound which forms strong acid on exposure to actinic radiation and a compound containing at least one cleavable C—O—C bond; and (2) a water-insoluble polymeric binder, soluble in aqueous-alkaline solutions, which contains units of formula I

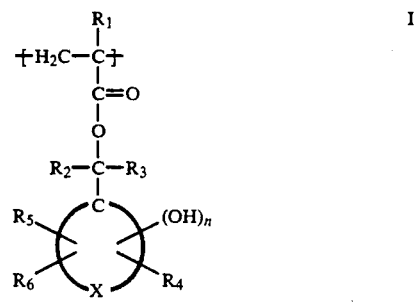

in which $R_1$ is a hydrogen or halogen atom, or a cyanide or an alkyl group, $R_2$, $R_3$ are identical or different and are hydrogen, or alkyl or aryl groups, $R_4$, $R_5$, $R_6$ are identical or different and are hydrogen or halogen atoms, or alkyl, alkoxy or aryl groups, X represents the atoms necessary to complete a monocyclic or polycyclic carbocyclic aromatic ring system, and n is 1, 2 or 3.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

A radiation-sensitive mixture according to the invention contains, as binder, a polymer having units of formula I

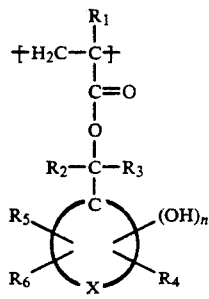

I in which
- $R_1$ is a hydrogen or halogen atom, or a cyanide or an alkyl group,
- $R_2$, $R_3$ are identical or different and are hydrogen, or alkyl or aryl groups,
- $R_4$, $R_5$, $R_6$ are identical or different and are hydrogen or halogen atoms, or alkyl, alkoxy or aryl groups,
- X represents the atoms necessary to complete a monocyclic or polycyclic carbocyclic aromatic ring system, and
- n is 1, 2 or 3.

In a preferred embodiment, the mixture contains, as binder, a polymer having units of formula I, in which
- $R_1$ is a hydrogen or halogen atom, or a cyanide or a $(C_1-C_6)$alkyl group,
- $R_2$, $R_3$ are identical or different and are hydrogen or $(C_1-C_4)$alkyl groups,
- $R_4$, $R_5$, $R_6$ are identical or different and are hydrogen, $(C_1-C_4)$alkyl groups or halogen,
- X represents the carbon atoms necessary to complete a benzene or naphthalene ring, and
- n is 1.

Particularly advantageous is a mixture in which
- $R_1$ is hydrogen or a methyl group,
- $R_2$, $R_3$, $R_4$ are hydrogen,
- $R_5$ is hydrogen, a $(C_1-C_4)$alkyl group or halogen,
- $R_6$ is hydrogen, a $(C_1-C_4)$alkyl group, an aryl group or halogen,
- X represents the carbon atoms necessary to complete a benzene or naphthalene ring, and
- n is 1.

In the case where R is an alkyl group, it generally contains 1 to 6, preferably 1 or 2, carbon atoms. Particularly preferred are compounds in which $R_1$ is a hydrogen atom or a methyl group.

At least one of the substituents $R_2$ and $R_3$ is preferably hydrogen, and it is preferred if both are hydrogen. If $R_2$ and $R_3$ are alkyl groups, they generally have 1 to 6, in particular 1 to 3, carbon atoms.

Of the substituents $R_4$, $R_5$ and $R_6$, $R_4$ is preferably hydrogen, $R_5$ is advantageously an alkyl group containing 1 to 4 carbon atoms, preferably a methyl group, and $R_6$ is an alkyl group containing 1 to 4 carbon atoms or an aryl group.

Alkyl groups mean branched and unbranched, saturated and unsaturated, groups having cyclic and open chains which may be substituted by halogen atoms or hydroxyl groups or contain ether or ketone groups. Unbranched alkyl groups containing 1 to 4 carbon atoms are preferred. Aryl groups mean heterocyclic or carbocyclic aromatic ring systems which may be monocyclic or polycyclic and substituted by aryl, alkoxy or hydroxyl groups or by halogen atoms.

The carbocyclic aromatic ring system X may be monocyclic or polycyclic. Of the carbocyclic ring systems, benzene and naphthalene systems may be mentioned in particular. The position of substituents on the ring system X is not subject to any kind of restrictions and depends solely on the preparative accessibility of the compounds.

In particular, chlorine, bromine and iodine atoms, preferably chlorine atoms, are suitable as halogen atoms.

Preferred examples of the units used according to the invention are those of formula II and III:

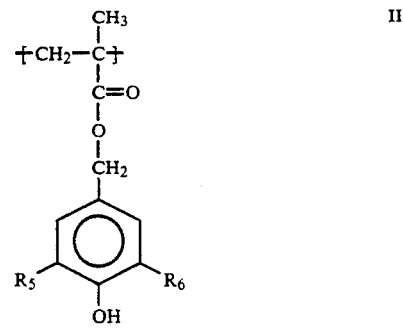

II in which $R_5$, $R_6$ are identical or different and are hydrogen, $(C_1-C_4)$alkyl or halogen,

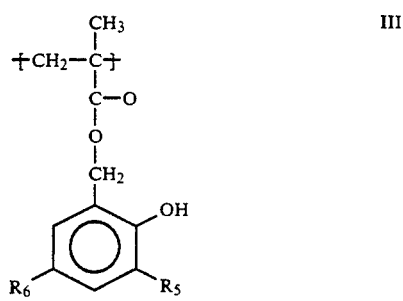

III in which
- $R_5$ is $(C_1-C_4)$alkyl or halogen, and
- $R_6$ is $(C_1-C_4)$alkyl, halogen or aryl optionally substituted by alkyl, alkoxy or halogen.

The monomers having units of formula I are generally prepared by reacting hydroxymethylsubstituted aromatics with acrylic or methacrylic acid, or by detachment of sodium halide between halomethylsubstituted aromatics and sodium acrylate or methacrylate. These processes and synthesis examples have been described in U.S. Pat. No. 3,116,305, DE 2,163,453 and also JP 58/170,731.

The homopolymerization of monomers containing units of formula I or their copolymerization with other monomers can be carried out by conventional methods, for example, in the presence of a polymerization initiator such as azobisisobutyronitrile in organic solvents such as methyl ethyl ketone or ethanol at elevated temperatures for a time period of 1 to 20 hours. In addition, a suspension, emulsion or bulk polymerization, which may also be initiated by radiation, heat or ionic initiators, is also possible.

The polymers containing units of formula I may be homopolymers which contain exclusively structural units of formula I, or copolymers of monomers corresponding to formula I and one or more different vinyl monomers such as styrene or alkyl or aryl acrylates or methacrylates, optionally also containing phenolic groups. Various phenol-containing monomers of formula I can be copolymerized with one another, optionally with further vinyl monomers.

The molecular weight of the homopolymers or copolymers may vary within wide limits; preferably, polymers having $M_w$ of about 1000 to 200,000, particularly those having $M_w$ of about 5000 to 100,000, are used. The hydroxyl number is generally in the range from about 100 to about 450, preferably between about 200 and 350.

The choice of suitable homopolymers or copolymers depends on the particular application and on the nature of the other components in the copying layer.

Suitable comonomer units are represented by formula IV

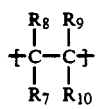

in which
$R_7$ is hydrogen,
$R_8$ is hydrogen or a carboxyl group which can be linked to $R_9$, if the latter is a carboxyl group, to form an acid anhydride or an imide optionally substituted by alkyl,
$R_9$ is an alkyl, alkoxy, alkoxycarbonyl, acyl, acyloxy, aryl, aryloxycarbonyl, formyl, cyanide, carboxyl, hydroxyl or aminocarbonyl group, and
$R_{10}$ is hydrogen, halogen or an alkyl group.
Preferably, units are used in which
$R_7$, $R_8$ are hydrogen,
$R_9$ is a $(C_1-C_4)$alkyl group, a $(C_1-C_8)$alkoxy group, an alkoxycarbonyl group containing 2 to 13 carbon atoms, an acyloxy group containing 2 to 18 carbon atoms, an aryl group containing 6 to 10 carbon atoms or an aryloxycarbonyl group containing 7 to 11 carbon atoms, it being possible for the aryl groups to be substituted by hydroxyl groups, and
$R_{10}$ is hydrogen or a methyl group.
If $R_9$ and $R_{10}$ are alkyl groups, they generally have 1 to 4 carbon atoms. Suitable representatives of $R_9$ include alkoxy groups containing 1 to 8 carbon atoms, alkoxycarbonyl groups containing 2 to 13 carbon atoms, acyloxy groups containing 2 to 18 carbon atoms and aryl groups containing 6 to 10 carbon atoms. The aminocarbonyl groups may be substituted with 1 to 8 carbon atoms.

Examples of these are styrene, α-chlorostyrene, α-methylstyrene, 2-, 3- or 4-chloromethylstyrene, 4-bromostyrene, methyl vinyl ether, ethyl vinyl ether, propyl vinyl ether, butyl vinyl ether, acrylonitrile, acrolein, butadiene, acrylic acid, methacrylic acid, the methyl, ethyl, propyl, butyl, pentyl, hexyl, octyl, decyl, dodecyl, 2-ethylhexyl, phenyl, benzyl, biphenyl or naphthyl esters of these acids, methacrylamide, acrylamide, vinyl acetate, vinyl isobutyl ketone and maleic anhydride.

Commoners containing phenolic hydroxyl groups preferably have the following structures:

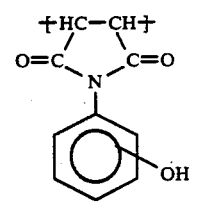

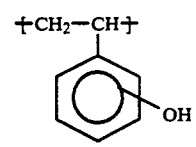

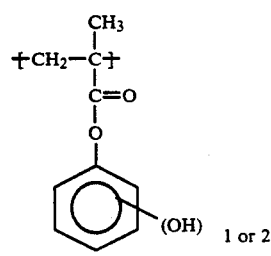

The content of units of formula I in the copolymer depends on the other components of the mixture and on the application. In general, polymers having a content of about 10 to 100, preferably about 15 to 80, mol percent of optionally different units of formula I are used in the mixture according to the invention.

To produce a mixture according to the invention, the polymeric binder is combined with photosensitive compounds or mixtures having a solubility in an aqueous-alkaline developer solution that is increased upon exposure to illumination. These include 1,2-quinone diazides and combinations of photolytic acid donors with acid-cleavable compounds.

The polymeric binder is present in these radiation-sensitive mixtures in the general range of about 10 to 95 percent by weight, preferably of about 50 to 90 percent by weight, based on the nonvolatile components.

As 1,2-quinone diazides, 1,2-naphthoquinone diazide-(2) 4- or -5-sulfonates or -sulfonamides are used. Of these, the esters, in particular those of the 5-sulfonic acids, are preferred. Suitable compounds of this type are known and are described, for example, in German Auslegeschrift 938,233, corresponding to British Patent 739,654.

The amount of o-quinone diazide compounds is generally about 3 to 50, preferably about 7 to 35, percent by weight, based on the nonvolatile components of the mixture.

It is also possible to use the 1,2-quinone diazide compounds in the form of their esters with the polymers according to the invention. The corresponding 1,2-quinone diazide acid chlorides are esterified with the hydroxyl groups of the basic polymers by processes known in the literature (German Auslegeschrift 2,507,548, corresponding to U.S. Pat. No. 4,139,384).

Materials based on acid-cleavable compounds can also be used with good effect in the mixture according to the invention, alone or mixed with 1,2-quinone diazides. Suitable acid-cleavable compounds include:
(a) those having at least one orthocarboxylic acid ester and/or carboxamide acetal grouping, the compounds also having a polymeric nature and it being possible for the groupings mentioned to occur as linking elements in the main chain or as lateral substituents, (b) oligomeric or polymeric compounds containing repeating acetal and/or ketal groupings in the main chain, and (c) compounds containing at least one enol ether or N-acylaminocarbonate grouping.

Acid-cleavable compounds of type (a) as components of radiation-sensitive mixtures are comprehensively described in EP 22,571, corresponding to U.S. Pat. No. 4,311,782; mixtures which contain compounds of type (b) are described in DE 2,306,248, corresponding to U.S. Pat. No. 3,779,778, and in DE 2,718,254 and U.S. Pat. No. 4,189,323; compounds of type (c) are described in EP 6,627, corresponding to U.S. Pat. No. 4,248,957.

The acid-cleavable compounds may be present in the radiation-sensitive mixture in the range between about 5 and 70, preferably between about 5 and 40, percent by weight, based on the nonvolatile components.

Suitable radiation-sensitive components which form strong acids on exposure to illumination include a large number of known compounds and mixtures such as phosphonium, sulfonium and iodonium salts, halogen compounds and organometallic-organohalogen combinations. The phosphonium, sulfonium and iodonium compounds are generally used in the form of their salts which are soluble in organic solvents, usually as precipitates with complex acids such as hydrofluoroboric acid, hexafluorophosphoric, hexafluoroantimonic and hexafluoroarsenic acid.

In principle, all organic halogen compounds which are also known as photochemical free-radical starters, for example, those containing at least one halogen atom on a carbon atom or an aromatic ring, can be used as halogen-containing radiation-sensitive compounds which form a hydrohalic acid (U.S. Pat. No. 3,515,552). Of these compounds, the s-triazine derivatives containing 2 halomethyl groups, in particular trichloromethyl groups, and an aromatic or unsaturated substituent in the triazine nucleus, such as are described in DE 2,718,259, corresponding to U.S. Pat. No. 4,189,323, are preferred. Also suitable are 2-trichloromethyl-1,3,4-oxadiazoles. The effect of these halogen-containing compounds can also be spectrally affected and increased by known sensitizers.

Examples of suitable photochemical acid donors include:
4-methyl-6-trichloromethyl-2-pyrone,
4-(3,4,5-trimethoxystyryl)-6-trichloromethyl-2-pyrone,
4-(4-methoxystyryl)-6-(3,3,3-trichloropropenyl)-2-pyrone,
2-trichloromethylbenzimidazole,
2-tribromomethylquinoline,
2,4-dimethyl-1-tribromoacetylbenzene,
3-nitro-1-tribromoacetylbenzene,
4-dibromoacetylbenzoic acid,
1,4-bis-dibromomethylbenzene,
tris-dibromomethyl-s-triazine,
2-(6-methoxy-2-naphthyl)-, 2-(1-naphthyl)-,
2-(4-ethoxy ethyl-1-naphthyl)-,
2-(benzo-3-pyranyl)-,
2-(4-methoxy-1-anthracyl)-,
2-(4-styrylphenyl)-,
2-(9-phenanthryl)-4,6-bis-trichloromethyl-s-triazine,
and the compounds listed in the examples.

The amount of photochemical acid donor may also vary considerably depending on its chemical nature and the composition of the layer. Favorable results are obtained with about 0.5 to 20 percent by weight, based on the total solids. Preferred are amounts of about 0.1 to 12 percent by weight. Particularly for photosensitive layers having a thickness of over 0.01 mm, relatively small amounts of acid donor are recommended.

In addition, a number of other oligomers and polymers, for example, phenolic resins of the novolak type or vinyl polymers such as polyvinyl acetals, polymethacrylates, polyacrylates, polyvinyl ethers and polyvinyl pyrrolidones, which may themselves be modified by comonomers, can also be used concomitantly. The most favorable proportion of these additives depends on the application/engineering requirements and the development conditions, and is generally not more than about 20 percent by weight of the polymer used according to the invention. For special requirements such as flexibility, adhesion, luster, etc., the radiation-sensitive layer may also contain substances such as polyglycols, cellulose ethers, for example, ethylcellulose, wetting agents and finely-divided pigments in small amounts. Soluble or even finely-divided dispersible dyes and also, depending on the application, UV absorbers may be added to the radiation-sensitive mixture. As dyes, the triphenylmethane dyes, for example, in the form of their carbinol bases, have proved particularly advantageous. The most favorable quantitative ratios of the components can easily be determined in each case by preliminary experiments.

The invention also relates to a radiation-sensitive recording material comprising a layer base and a radiation-sensitive layer which contains a layer of the mixture coated on the layer base.

In order to coat a layer base, the mixture is generally dissolved in a solvent. The choice of solvent has to be matched to the intended coating process, the layer thickness and the drying conditions. Suitable solvents for the mixture according to the invention are ketones such as methyl ethyl ketone, chlorinated hydrocarbons, such as trichloroethylene and 1,1,1-trichloroethane, alcohols such as n-propanol, ethers, such as tetrahydrofuran, alcohol ethers, such as ethylene glycol monoethyl ether, propylene glycol monomethyl ether and esters, such as butyl acetate or alkylene glycol monoalkyl ether acetates. It is also possible to use mixtures which additionally contain solvents for special purposes, such as acetonitrile, dioxane or dimethylformamide. In principle, any solvent can be used which does not react irreversibly with the layer components. Partial ethers of glycols, in particular ethylene glycol monomethyl ether and propylene glycol monomethyl ether, alone or as a mixture, are particularly preferred.

Metals are usually used as layer bases for layer thicknesses below approximately 10 $\mu$m. For offset printing plates it is possible to use bright-rolled, mechanically and/or electrochemically roughened and optionally anodized aluminum which may also have been pretreated chemically, for example, with polyvinylphosphonic acid, silicates, phosphates, hexafluorozirconates or with hydrolyzed tetraethyl orthosilicate.

The layer base is coated in a known manner by spin-coating, spraying, immersing, rolling, or by means of slot dies or doctor blades, or by casting.

For exposure, the standard light sources such as fluorescent lamps, xenon pulse lamps, metal-halidedoped high-pressure mercury vapor lamps and carbon arc lamps may be used. Exposure to illumination or irradiation is understood to mean in this description the action of actinic electromagnetic radiation in the wavelength ranges below about 500 nm. All the radiation sources which emit in this wavelength range are suitable in principle.

Laser irradiation apparatus, in particular automatic processing systems which embody, for example, an argon or krypton ion laser as radiation source, can be used with advantage. The irradiation can also be carried out with electron beams. In this case, acid-forming compounds which are not photosensitive in the usual sense, for example, halogenated aromatic compounds or halogenated polymeric hydrocarbons, may be used as initiators of the solubilizing reaction. X-rays may also be used to produce images.

The layer exposed or irradiated imagewise can be removed in a known manner with practically the same developers as those known for commercial naphthoquinone diazide layers and copying resists, or the novel materials may advantageously be matched in their copying behavior to the known aids such as developers and programmed spray-development apparatus. The aqueous developer solutions may contain, for example, alkali-metal phosphates, alkali-metal silicates or alkali-metal hydroxides, in addition to wetting agents and, optionally, smaller proportions of organic solvents. In certain cases, solvent/water mixtures can also be used as developers. The choice of the most favorable developer can be determined by experiments with the layer used in a particular case. If necessary, the development may be promoted mechanically.

For printing plate applications, the developed plates may be heated for a short time at elevated temperatures, as is known for diazo layers from British Patent 1,154,749, to increase the resistance during printing and also the resistance to wash-out agents, correction fluids and printing inks which can be cured with UV light.

The invention provides radiation-sensitive mixtures and recording materials having a good shelf life, good photosensitivity and perfect development behavior. They can be used in long print runs, have an outstanding heat resistance when used as a photoresist, can be thermally post-cured and have a good resistance to chemicals after post-curing compared with the known materials.

Examples of preferred embodiments are set forth in the following illustrative examples. In the examples, parts by weight (pbw) and parts by volume (pbv) are in the ratio of g to cm$^3$. Unless otherwise specified, percentage and quantity ratios are to be understood in units of weight.

Polymers according to the invention can be prepared by combining:

1 mol of the monomer or monomer mixture (cf. Table 1), and 0.015 mol of azobisisobutyronitrile in tetrahydrofuran to form a starting solution having a solids content of 40%. The starting solution is polymerized for 17 hours at 70° C. under inert nitrogen. Then the mixture is introduced, while stirring vigorously, into 25 times the volume of water. The polymer precipitated is dried at 50° C. in vacuo for 48 hours.

Exemplary monomers are listed in Table 1, with reference to the following general formula:

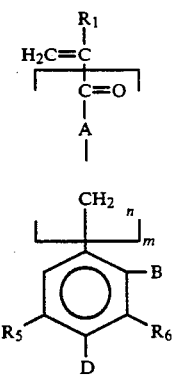

Table 2 summarizes the polymers prepared using the monomers in Table 1.

TABLE 1

| Monomer No. | $R_1$ | A | n | m | $R_5$ | $R_6$ | B | D | Notes |
|---|---|---|---|---|---|---|---|---|---|
| 1 | $CH_3$ | O | 1 | 1 | $CH_3$ | $CH_3$ | OH | H | according to the invention |
| 2 | $CH_3$ | O | 1 | 1 | $CH_3$ | $CH_3$ | H | OH | according to the invention |
| 3 | H | O | 1 | 1 | $CH_3$ | $CH_3$ | H | OH | according to the invention |
| 4 | $CH_3$ | O | 1 | 1 | $CH_3$ | H | OH | H | according to the invention |
| C1 | $CH_3$ | NH | 1 | 1 | $CH_3$ | $CH_3$ | H | OH | comparison in accordance with DE-A-3,820,699 |
| C2 | $CH_3$ | O | 0 | 1 | H | H | OH | H | comparison in accordance with EP-A-0,212,440 |
| C3 | H | — | 0 | 0 | H | H | H | OH | Comparison in accordance with DE-A-2,322,230 |

TABLE 2

| Polymer No. | Monomer (mol-%) | Monomer (mol-%) | Monomer (mol-%) | RSV Value[1] | Notes |
|---|---|---|---|---|---|
| 1 | 1 (100) | — | — | 0.23 | according to the invention |
| 2 | 2 (100) | — | — | 0.22 | according to the invention |
| 3 | 3 (100) | — | — | 0.24 | according to the invention |
| 4 | 4 (100) | — | — | 0.22 | according to the invention |
| 5 | 2 (75) | Styrene (25) | — | 0.20 | according to the invention |
| C1 | C1 (100) | — | — | 0.26 | comparison example |
| C2 | C1 (20) | C2 (55) | Styrene (25) | 0.22 | comparison example |
| C3 | C2 (100) | — | — | 0.24 | comparison example |
| C4 | C2 (75) | Styrene (25) | — | 0.21 | comparison example |

TABLE 2-continued

| Polymer No. | Monomer (mol-%) | Monomer (mol-%) | Monomer (mol-%) | RSV Value[1] | Notes |
|---|---|---|---|---|---|
| C5 | C3 (100) | — | | 0.23 | comparison example |
| C6 | C3 (50) | Styrene (25) | | 0.20 | comparison example |

[1]RSV = reduced specific viscosity of the polymers in dl/g; determined in dimethylformamide

EXAMPLE 1

An aluminum plate electrolytically roughened in hydrochloric acid, anodized in sulfuric acid and hydrophilized with polyvinylphosphonic acid is spincoated with the following solution:

7.0 pbw (parts by weight) of binder (cf. Table 3),
1.5 pbw of an esterification product of 3 mol of 1,2-naphthoquinone-(2)-diazide-4-sulfonyl chloride and 1 mol of 2,3,4-trihydroxybenzophenone,
0.2 pbw of 1,2-naphthoquinone-(2)-diazide-4-sulfonyl chloride,
0.08 pbw of Victoria pure blue (C.I. 44 045),
100 pbw of a solvent mixture composed of tetrahydrofuran and propylene glycol mono-methyl ether (55:45).

A layer thickness of 2 μm results after drying at 100° C. for 2 minutes.

Photosensitivity test:

The printing plates are exposed for 60 seconds (s) under a 5 kW metal-halide lamp at a distance of 110 cm through a continuous-tone wedge having 13 density steps of 0.15 each (exposure wedge "BK 01" supplied by Hoechst AG) and developed for 60 seconds in one of the following developers:

Developer A
8.5 pbw:$Na_2SiO_3 \times 9\ H_2O$,
0.8 pbw:NaOH, and
1.5 pbw:$Na_2B_4O_7 \times 10\ H_2O$ in
89.2 pbw:$H_2O$.

Developer B
5.3 pbw of sodium metasilicate nonahydrate,
3.4 pbw of trisodium phosphate dodecahydrate,
0.3 pbw of sodium hydrogenphosphate (anhydrous),
91.0 pbw of water.

The photosensitivity is assessed on the basis of step 3 of the continuous-tone wedge:
  open = already free of copying layer;
  not open = copying layer residues still present.

Development behavior test:

The exposed plates are developed for 15 seconds and then inked with a commercial black offset ink. The occurrence of tone in the image-free areas is assessed.

Thermal crosslinking behavior test:

The plates are wiped over with a commercial burning-in gum (for example, RC 99 supplied by HOECHST AG) and baked for 5 minutes at 230° C. in a resist drying oven. The resistance of the baked plates to chemicals is tested with dimethylformamide.

Results of the photosensitivity test, development behavior test and thermal crosslinking behavior test are shown in Table 3. Printing trials were carried out in a sheet-fed offset press on a number of these plates in the thermally uncured state, and these results are shown in Table 4.

TABLE 3

| Example No. | Polymer No. | Continuous-tone stage 3 | Developer | Development | Resistance to chemicals after baking |
|---|---|---|---|---|---|
| 1-1 | 1 | open | B | tone-free | + |
| 1-2 | 2 | open | B | tone-free | + |
| 1-3 | 3 | open | B | tone-free | + |
| 1-4 | 4 | open | B | tone-free | + |
| 1-5 | 5 | open | A | tone-free | + |
| 1-6 | C1 | not open | B | tone | + |
| 1-7 | C2 | open | A | tone-free | — |
| 1-8 | C3 | open | B | tone-free | — |
| 1-9 | C4 | open | A | tone-free | — |
| 1-10 | C5 | open | B | tone-free | — |
| 1-11 | C6 | open | A | tone-free | — |
| 1-12 | m-cresol formaldehyde novolak (comparison) | open | A | tone-free | + |

TABLE 4

| Example No. | Polymer | Print run |
|---|---|---|
| 1-2 | 2 | 150,000 |
| 1-5 | 5 | 160,000 |
| 1-7 (comparison) | C2 | 160,000 |
| 1-9 (comparison) | C4 | 150,000 |
| 1-11 (comparison) | C6 | 140,000 |
| 1-12 (comparison) | m-cresol formaldehyde novolak | 90,000 |

The results show that printing plate copying layers containing the mixture according to the invention yield a higher print run than conventional positive copying layers containing novolaks as binders, that they are resistant to aggressive chemicals as a result of thermal post-curing, and that they have no disadvantageous effects on the good photosensitivity and development.

EXAMPLE 2

To produce a positive dry resist, coating solutions are prepared from:
40.0 pbw of binder (cf. Table 5),
10.0 pbw of a compound containing acid-cleavable C—O—C units (Table 5),
0.5 pbw of a photochemical acid-former (Table 5),
6.0 pbw of polyethyl acrylate,
0.01 pbw of crystal violet base (C.I. 42 555:1),
100 pbw of butanone.

The solutions are in each case spun onto 26 μm thick, biaxially-stretched and heat-set polyethylene terephthalate sheets and then post-dried for 10 minutes at 100° C. in a circulating-air drying oven. The rotary speed of the spinner is regulated so that a layer thickness of 25 μm is produced. As a protection against dust and scratches, a polyethylene sheet is also applied on top as a top sheet.

To produce printed circuit boards, the top sheet is peeled off and the dry resists are laminated in a commercial laminator onto a cleaned, preheated base comprising an insulating material having a 35 μm thick copper coating on one or both sides. After peeling off the base sheet, and optionally post-drying, exposure is carried out for 30 seconds under a master using a 5 kW metal-halide lamp at a distance of 110 cm. After a waiting period of 15 minutes, development is carried out for 90 seconds in a 1% strength sodium hydroxide solution. The resist stencils produced in this way have outstanding resistance to electroplating, in particular to the build-up of copper and Pb/Sn alloys during electroplating.

Such boards can then be exposed and developed again. With this procedure, Pb/Sn soldering eyelets can be built up by electroplating at the drilled holes in a first step, and then the conductor track pattern can be transferred to the still existing resist layer in a second exposure and development step. After the exposed copper has been etched with ammoniacal Cu(II) chloride solution, a copper-technology printed circuit board is obtained, i.e., the Pb/Sn alloy is only built up at those points where it is required in the subsequent soldering process.

The results are shown in Table 5. The following compounds having acid-cleavable C—O—C units were used:

No. 1: polymeric orthoester prepared by condensing trimethyl orthoformate with 4-oxa-6,6-bishydroxymethyl-1-octanol, No. 2: polyacetal prepared from triethylene glycol and 2-ethylbutyraldehyde.

The following photochemical acid formers were used:

No. 1: 2-(4-ethoxy-1-naphthyl)-4,6-bis-trichloromethyl-s-triazine,

No. 2: 2-(4-styrylphenyl)-4,6-bis-trichloromethyl-s-triazine.

TABLE 5

| Example No. | Polymer No. | Acid-cleavable compound No. | Photo-chemical acid former No. | Exposure time (s) |
|---|---|---|---|---|
| 2-1 | 5 | 1 | 1 | 25 |
| 2-2 | 5 | 1 | 2 | 23 |
| 2-3 | 5 | 2 | 1 | 27 |
| 2-4 | 5 | 2 | 2 | 25 |

EXAMPLE 3

To produce high-resolution positive liquid resists, the following coating solutions are prepared:

26 pbw of binder (cf. Table 6),
4 pbw of an esterification product of 3 mol of 1,2-naphthoquinone-(2)-diazide-4-sulfonyl chloride and 1 mol of 2,3,4-trihydroxybenzophenone,
80 pbw of propylene glycol monomethyl ether acetate.

After filtering through a filter having a pore diameter of 0.2 μm (Millipore), the photoresist solutions are spun onto commercial silicon wafers which have been polished as usual and provided by oxidation with a 0.2 μm thick $SiO_2$ layer. At a rotary speed of 8000 rpm, layer thicknesses of between 0.9 and 1 μm are obtained.

The coated wafers are dried for 30 minutes at 90° C. After cooling and conditioning to a given room climater of 23° C. and 40 to 50% relative humidity, the wafers are exposed in a contact exposure apparatus with an intensity of 4.5 mW/cm² at 365 nm under a commercial chromium mask and developed for 60 seconds in a 2.86% strength tetramethylammonium hydroxide solution. In all cases, it is possible to reproduce 1 μm lines and gaps.

After a heat treatment of 30 minutes at 150° C., the edges of the structures are assessed. The results are shown in Table 6.

TABLE 6

| Example No. | Polymer No. | Exposure time (s) | Edge structure after heat treatment |
|---|---|---|---|
| 3-1 | 1 | 20 | little changed |
| 3-2 | 2 | 20 | little changed |
| 3-3 | 3 | 20 | slightly rounded |
| 3-4 | 4 | 20 | little changed |
| 3-5 | 5 | 25 | little changed |
| 3-6 | m-cresol formaldehyde novolak (comparison) | 25 | very sharp inclination of the edges |

What is claimed is:

1. A positive-working radiation-sensitive mixture, comprising, in admixture:

(1) a radiation-sensitive component selected from the group consisting of:
      (a) a 1,2-quinone diazide, and
      (b) a combination of a compound which forms strong acid on exposure to actinic radiation and a compound containing at least one cleavable C—O—C bond
   wherein said radiation-sensitive component is present in an amount sufficient to increase solubility in aqueous-alkaline solution of a layer of the mixture that has been coated on a support and exposed to actinic radiation;

(2) a water-insoluble polymeric binder, soluble in aqueous-alkaline solutions, in an amount sufficient to form a homogeneous film when a layer of the mixture is coated on a support, said binder containing about 10 to 100 ml % of units of formula I $$\{H_2C-C\}\begin{array}{c}R_1\\|\\|\\C=O\\|\\O\\|\\R_2-C-R_3\\|\\C\end{array}$$

(with aromatic ring bearing $R_4$, $R_5$, $R_6$, X, and $(OH)_n$)

in which
$R_1$ is a hydrogen or halogen atom, or a cyanide or an alkyl group,
$R_2$, $R_3$ are identical or different and are hydrogen, or alkyl or aryl groups,
$R_4$, $R_5$, $R_6$ are identical or different and are hydrogen or halogen atoms, or alkyl, alkoxy or aryl groups,
X represents the atoms necessary to complete a monocyclic or polycyclic carbocyclic aromatic ring system, and
n is 1, 2 or 3.

2. A mixture as claimed in claim 1, wherein
$R_1$ is a hydrogen or halogen atom, or a cyanide or a $(C_1-C_6)$alkyl group,
$R_2$, $R_3$ are identical or different and are hydrogen or $(C_1-C_4)$alkyl groups, $R_4$, $R_5$, $R_6$ are identical or different and are hydrogen, $(C_1-C_4)$alkyl groups or halogen, X represents the carbon atoms necessary to complete a benzene or naphthalene ring, and n is 1.

3. A mixture as claimed in claim 1, wherein $R_1$ is hydrogen or a methyl group, $R_2$, $R_3$, $R_4$ are hydrogen, $R_5$ is hydrogen, a $(C_1-C_4)$alkyl group or halogen, $R_6$ is hydrogen, a $(C_1-C_4)$alkyl group, an aryl group or halogen, X represents the carbon atoms necessary to complete a benzene or naphthalene ring, and n is 1.

4. A mixture as claimed in claim 1, wherein the binder contains units of formula II

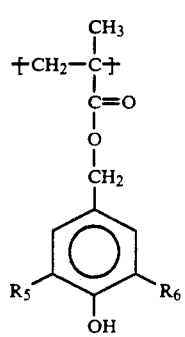

in which $R_5$, $R_6$ are identical or different and are hydrogen, $(C_1-C_4)$alkyl or halogen, 5. A mixture as claimed in claim 1, wherein the binder contains units of formula III

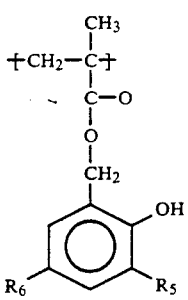

in which $R_5$ is $(C_1-C_4)$alkyl or halogen, and $R_6$ is $(C_1-C_4)$alkyl, halogen or aryl optionally substituted by alkyl, alkoxy or halogen.

6. A mixture as claimed in claim 1, wherein the polymeric binder contains at least one repeating unit of formula IV

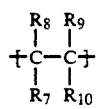

in which $R_7$ is hydrogen, $R_8$ is hydrogen or a carboxyl group which can be linked to $R_9$, when $R_9$ is a carboxyl group, to form an acid anhydride or an imide optionally substituted by alkyl, $R_9$ is an alkyl, alkoxy, alkoxycarbonyl, acyl, acyloxy, aryl, aryloxycarbonyl, formyl, cyanide, carboxyl, hydroxyl or aminocarbonyl group, and $R_{10}$ is hydrogen, halogen or an alkyl group.

7. A mixture as claimed in claim 6, wherein $R_7$, $R_8$ are hydrogen, $R_9$ is a $(C_1-C_4)$alkyl group, a $(C_1-C_8)$alkoxy group, an alkoxycarbonyl group containing 2 to 13 carbon atoms, an acyloxy group containing 2 to 18 carbon atoms, an aryl group containing 6 to 10 carbon atoms or an aryloxycarbonyl group containing 7 to carbon atoms, it being possible for the aryl groups to be substituted by hydroxyl groups, and $R_{10}$ is hydrogen or a methyl group.

8. A radiation-sensitive recording material comprising:
a layer base; and
a layer of a radiation-sensitive mixture as claimed in claim 1.

9. A mixture as claimed in claim 1, wherein $R_1$ is a $(C_1-C_2)$ alkyl group.

10. A mixture as claimed in claim 1, wherein at least one of $R_2$ and $R_3$ is hydrogen.

11. A mixture as claimed in claim 1, wherein $R_2R_3$ are both hydrogen.

12. A mixture as claimed in claim 1, wherein the hydroxyl number of the binder is between about 100 and 450.

13. A mixture as claimed in claim 1, wherein the hydroxyl number of the binder is between about 200 and 350.

14. A mixture as claimed in claim 1, consisting essentially of the recited components.

15. A mixture as claimed in claim 1, wherein the radiation-sensitive component is a 1,2-quinonediazide that is present in an amount of from about 3 to 50 percent by weight, based on the total weight of the non-volatile components of the mixture.

16. A mixture as claimed in claim 1, wherein the radiation-sensitive component is a combination of about 0.5 to 20% by weight of a compound which forms strong acid on exposure to actinic radiation and about 5 to 70% by weight of a compound containing at least one cleavable C—O—C bond, in each case based on the total weight of the non-volatile components of the mixture.

17. A mixture as claimed in claim 15, wherein the binder is present in an amount of from about 10 to 95% by weight, based on the non-volatile components of the mixture.

18. A mixture as claimed in claim 16, wherein the binder is present in an amount of from about 10 to 95% by weight, based on the non-volatile components of the mixture.

19. A mixture as claimed in claim 1, wherein the binder has a molecular weight of about 1000 to 200,000.

20. A mixture as claimed in claim 1, wherein the binder has a molecular weight of about 5000 to 100,000.

* * * * *

UNITED STATES PATENT AND TRADEMARK OFFICE
CERTIFICATE OF CORRECTION

PATENT NO. : 5,275,908
DATED : January 4, 1994
INVENTOR(S) : ELSAESSER et al.

It is certified that error appears in the above-indentified patent and that said Letters Patent is hereby corrected as shown below:

Column 16, line 15, claim 7, "7 to" should read --7 to 11--.

Signed and Sealed this

Twenty-sixth Day of July, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,275,908
DATED : January 4, 1994
INVENTOR(S) : Andreas ELSAESSER et al.

It is certified that error appears in the above-indentified patent and that said Letters Patent is hereby corrected as shown below:

Column 14, line 37, claim 1, "100 ml %" should read

--100 mol %--.

Signed and Sealed this

Fourteenth Day of March, 1995

Attest:

BRUCE LEHMAN

Attesting Officer     Commissioner of Patents and Trademarks